United States Patent
Baumann et al.

(10) Patent No.: US 9,242,867 B2
(45) Date of Patent: Jan. 26, 2016

(54) POLYCRYSTALLINE SILICON

(71) Applicant: Wacker Chemie AG, Munich (DE)

(72) Inventors: Robert Baumann, Burghausen (DE); Robert Hoelzl, Julbach (DE); Michael Weichselgartner, Wurmannsquick (DE)

(73) Assignee: Wacker Chemie AG, Munich (DE)

( * ) Notice: Subject to any disclaimer, the term of this patent is extended or adjusted under 35 U.S.C. 154(b) by 245 days.

(21) Appl. No.: 13/711,836

(22) Filed: Dec. 12, 2012

(65) Prior Publication Data

US 2013/0177493 A1    Jul. 11, 2013

(30) Foreign Application Priority Data

Dec. 21, 2011  (DE) .......................... 10 2011 089 479

(51) Int. Cl.
| | | |
|---|---|---|
| *C01B 33/02* | (2006.01) | |
| *C01B 33/035* | (2006.01) | |
| *H01L 31/0368* | (2006.01) | |
| *C01B 33/107* | (2006.01) | |

(52) U.S. Cl.
CPC .............. *C01B 33/02* (2013.01); *C01B 33/035* (2013.01); *C01B 33/10778* (2013.01); *H01L 31/03682* (2013.01); *Y02E 10/546* (2013.01)

(58) Field of Classification Search
CPC .. C01B 33/02; C01B 33/10778; C01B 33/035
USPC ................................................. 423/348–350
See application file for complete search history.

(56) References Cited

U.S. PATENT DOCUMENTS

| | | | |
|---|---|---|---|
| 4,921,026 A | 5/1990 | Flagella et al. | |
| 7,927,571 B2 | 4/2011 | Altmann et al. | |
| 2003/0159647 A1 * | 8/2003 | Arvidson et al. | ............... 117/30 |
| 2006/0249200 A1 | 11/2006 | Kato et al. | |
| 2012/0052297 A1 * | 3/2012 | Pech et al. | ................... 428/402 |
| 2012/0060562 A1 | 3/2012 | Wochner et al. | |

FOREIGN PATENT DOCUMENTS

| | | |
|---|---|---|
| DE | 3007377 A | 3/1981 |
| DE | 102005044328 A1 | 3/2006 |
| DE | 102011077455 A1 * | 11/2011 |
| EP | 0345618 B1 | 2/1993 |
| EP | 2431329 A1 | 3/2012 |
| JP | 2111613 A | 4/1990 |
| JP | 10316413 A | 12/1998 |
| JP | 2007001791 A | 1/2007 |

OTHER PUBLICATIONS

PatBase abstract in English for DE102011077455.
English-language abstract for JP 10-316413.
English-language abstract for JP 2007-001791.

* cited by examiner

*Primary Examiner* — Anthony J Zimmer
(74) *Attorney, Agent, or Firm* — Caesar Rivise, PC

(57) ABSTRACT

The invention provides polycrystalline silicon having concentrations of dopants of 1-10 ppta of boron, 1-20 ppta of phosphorus, 1-10 ppta of arsenic, 0.01-1 ppta of aluminum, and having a charge carrier lifetime of at least 2000 and at most 4500 µs.

20 Claims, No Drawings

… (1)

POLYCRYSTALLINE SILICON

BACKGROUND OF THE INVENTION

The invention provides polycrystalline silicon.

On the industrial scale, crude silicon is obtained by the reduction of silicon dioxide with carbon in a light arc furnace at temperatures of about 2000° C.

This affords "metallurgical grade" silicon ($Si_{mg}$) having a purity of about 98-99%.

For applications in photovoltaics and in microelectronics, the metallurgical grade silicon has to be purified.

For this purpose, it is reacted, for example, with gaseous hydrogen chloride at 300-350° C. in a fluidized bed reactor to give a silicon-containing gas, for example monosilane or a halosilane, for example trichlorosilane. This is followed by distillation steps in order to purify the silicon-containing gas.

This purified silicon-containing gas then serves as a starting material for the production of high-purity polycrystalline silicon.

The polycrystalline silicon, often also called polysilicon for short, is typically produced by means of the Siemens process. This involves heating thin filament rods of silicon by direct passage of current in a bell-shaped reactor ("Siemens reactor"), with introduction of a reaction gas comprising a silicon-containing component and hydrogen.

The silicon-containing component of the reaction gas is generally monosilane or a halosilane of the general composition $SiH_nX_{4-n}$ (n=0, 1, 2, 3; X=Cl, Br, I). It is preferably a chlorosilane, more preferably trichlorosilane. Predominantly $SiH_4$ or $SiHCl_3$ (trichlorosilane, TCS) is used in a mixture with hydrogen.

In the Siemens process, the filament rods are typically inserted perpendicularly into electrodes present at the reactor base, through which they are connected to the power supply. Every two filament rods are coupled via a horizontal bridge (likewise composed of silicon) and form a support body for the silicon deposition. The bridge coupling produces the typical U shape of the carrier bodies, which are also called thin rods.

Polysilicon is deposited on the heated rods and the bridge, as a result of which the rod diameter grows with time (CVD=Chemical Vapor Deposition/gas phase deposition).

After the deposition has ended, these polysilicon rods are typically processed further by means of mechanical processing to give fragments of different size classes, optionally subjected to a wet-chemical purification and finally packed.

The polysilicon can, however, also be processed further in the form of rods or rod pieces. This is especially true for the use of the polysilicon in an FZ process, in which a single crystal is produced from a polysilicon rod.

Polycrystalline silicon (polysilicon for short) serves as a starting material in the production of monocrystalline silicon by means of crucible pulling (Czochralski or CZ process) or by means of zone melting (Floatzone or FZ process).

This monocrystalline silicon is divided into wafers and, after a multitude of mechanical, chemical and chemomechanical processing operations, used in the semiconductor industry for manufacture of electronic components (chips).

More particularly, however, polycrystalline silicon is required for production of mono- or multicrystalline silicon by means of pulling or casting processes, this mono- or multicrystalline silicon serving for production of solar cells for photovoltaics.

Since the quality demands on polysilicon are becoming ever higher, quality control over the entire process chain is indispensible. The material is analyzed, for example, with regard to contaminations with metals or dopants. Contamination in bulk should be distinguished from contamination at the surface of the polysilicon fragments or rod pieces.

It is also customary to convert the polysilicon produced to monocrystalline material for the purposes of quality control. In this case, the monocrystalline material is analyzed. Here too, metal contaminations, which are assessed particularly critically in the customer processes in the semiconductor industry, are of particular significance. The silicon is, however, also analyzed with regard to carbon and dopants such as aluminum, boron, phosphorus and arsenic.

Dopants are analyzed by means of photoluminescence to SEMI MF 1398 on an FZ single crystal produced from the polycrystalline material (SEMI MF 1723). As an alternative, low-temperature FTIR (Fourier Transformer IR spectroscopy) is used (SEMI MF 1630).

FTIR (SEMI MF 1188, SEMI MF 1391) enables the determination of carbon and oxygen concentrations.

The fundamentals of the FZ process are described, for example, in DE-3007377 A.

In the FZ process, a polycrystalline stock rod is gradually melted with the aid of a high-frequency coil, and the molten material is converted to a single crystal by seeding with a monocrystalline seed crystal and subsequent recrystallization. In the course of recrystallization, the diameter of the single crystal forming is first increased in a cone shape (cone formation) until a desired final diameter has been attained (rod formation). In the cone formation phase, the single crystal is also mechanically supported in order to take the load of the thin seed crystal.

In addition, the silicon pulled to a single crystal for analytical purposes is analyzed for its charge carrier lifetime. Different measurement techniques are used here, for example that according to SEMI PV9.

The charge carrier lifetime is crucial for the use of the polycrystalline silicon in the semiconductor and photovoltaics sectors, in order to ensure maximum efficiency of the components.

DE 10 2005 044 328 A1 discloses a polycrystalline silicon material having a lifetime of 2 to 500 µs. For production of the polycrystalline silicon material, the Siemens process is used, and the silane gas used is a trichlorosilane or a monosilane having at least 10 and at most 1000 ppb of boron. The polycrystalline silicon material is used for solar power generation.

According to DE 10 2005 044 328 A1, the purity of silane of semiconductor quality is less than 10 ppb of boron. In addition, the sum of Fe, Cu, Ni, Cr, Zn and Na is 5 ppb or less (ICP method), the donor amount of Al and B is 0.1 ppb or less (photoluminescence), and the lifetime is 1000 µs or more (ASTM F28-91).

EP 0 345 618 B1 discloses a polycrystalline silicon rod with less than 15 ppta of boron and less than 20 ppta of phosphorus. Such a rod can be used to produce, by means of floating zone processes, monocrystalline silicon having a specific resistivity of at least 10 000 ohmcm and a lifetime of at least 10 000 µs.

The polycrystalline silicon rod is produced by means of the Siemens process. The polycrystalline silicon rod contains less than 5 ppta of aluminum and less than 0.1 ppma of carbon. The filament rod contains less than 0.2 ppba of boron and less than 0.2 ppba of phosphorus.

In the Siemens process in EP 0 345 618 B1, preference is given to using monosilane. The reason given for this is that boron and phosphorus can easily be removed from monosilane. In contrast, trichlorosilane does not allow effective distillation because the adsorbents used contaminate the trichlorosilane with aluminum.

This problem gave rise to the objective of the invention.

DESCRIPTION OF THE INVENTION

The object of the invention is achieved by polycrystalline silicon having concentrations of dopants of 1-10 ppta of boron,
1-20 ppta of phosphorus,
1-10 ppta of arsenic,
and 0.01-1 ppta of aluminum,
and having a charge carrier lifetime of at least 2000 and at most 4500 μs.

The inventive polycrystalline silicon has an exceptionally low dopant concentration, especially a low concentration of aluminum, and at the same time a relatively high charge carrier lifetime.

The phosphorus concentration is preferably 1-10 ppta.
The boron concentration is preferably 1-5 ppta.
The arsenic concentration is preferably 1-5 ppta.
The dopant concentrations are determined as follows:
Growth of a single crystal by means of FZ from a core sample of the polycrystalline silicon, removal of a rod piece, etching with HF/HNO3, photoluminescence.

The polycrystalline silicon further features the following interior (bulk) concentrations of metals:
Fe 10-100 pptw, preferably 10-60 pptw, most preferably 10-40 pptw
Cu 10-250 pptw, preferably 10-100 pptw, most preferably 10-50 pptw
Ni 1-20 pptw, preferably 1-10 pptw
Cr 0.1-10 pptw, preferably 0.1-2 pptw
Zn 1-20 pptw, preferably 1-4 pptw
Na 10-1000 pptw, preferably 10-700 pptw, most preferably 10-400 pptw
The concentration of Fe, Cu, Ni, Cr, Zn and Na totals less than 1400 pptw, preferably 35-850 pptw, most preferably 35-550 pptw.

The metal concentrations are determined by means of INAA on a sample (etched with HF/HNO3); cf. SEMI PV10-1110.

INAA (Instrumental Neutron Activation Analysis) is based on reactions in the atomic nucleus. The atoms of the sample to be analyzed are activated by a neutron beam. During the irradiation in the reactor, some of the atomic nuclei capture neutrons—this forms unstable isotopes. The measurement of the radiation released in the course of radioactive decomposition thereof allows conclusions about the nature and amount of the elements present in the analysis sample.

The charge carrier lifetime is determined to SEMI PV9-0611 ("Test Method for Excess Charge Carrier Decay in PV Silicon Materials by Non-Contact Measurements of Microwave Reflectance After a Short Illumination Pulse").

Production of the Polycrystalline Silicon
a) Preparation of Trichlorosilane/Distillation
The polycrystalline silicon is obtained from reaction of trichlorosilane and hydrogen in a Siemens reactor. TCS is obtained principally via three different processes.

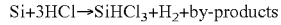
$$Si + 3HCl \rightarrow SiHCl_3 + H_2 + \text{by-products} \quad A)$$

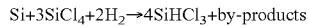
$$Si + 3SiCl_4 + 2H_2 \rightarrow 4SiHCl_3 + \text{by-products} \quad B)$$

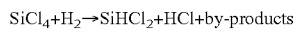
$$SiCl_4 + H_2 \rightarrow SiHCl_2 + HCl + \text{by-products} \quad C)$$

These processes form, as well as other by-products or impurities, relatively large amounts of dichlorosilane (DCS).

For instance, it is known that, in the hydrochlorination of metallurgical silicon according to (A), about 0.1-1.0% DCS is present in the reaction product.

The reaction of metallurgical silicon with silicon tetrachloride (STC) and hydrogen according to (B) generally gives even higher DCS contents in the reaction product, especially when copper is used as a catalyst for this process.

In the hydrogenation of STC according to (C) too, 0.05-1.0% DCS is found in the reaction product.

Thus, the reaction products are chlorosilane mixtures comprising TCS, DCS and STC.

These chlorosilane mixtures are purified by a distillation process in several distillation columns. It is known that the mixtures contain boron.

In the distillation, low-boiling boron compounds are branched off from the distillation columns by means of top streams comprising boron-enriched DCS, and relatively high-boiling boron compounds by means of a boron-enriched bottom stream comprising high boilers.

Preferably, the mixture of chlorosilanes provided is obtained by means of reaction of metallurgical silicon with HCl in a fluidized bed reactor at 350-400° C.

Chlorosilane mixture is preferably supplied to a first separating column, with less than 10 ppm of STC present in a first fraction from this separation column and less than 10 ppm of TCS in a second fraction from this separating column.

Preferably, the second fraction from the separating column is supplied to a second column and separated by distillation into a top stream comprising STC and a boron-enriched bottom stream comprising high boilers.

The first fraction from the separating column is preferably supplied to a third column and separated by distillation into a bottom stream comprising TCS, and a boron-enriched top stream comprising, as well as TCS, low boilers such as DCS.

The top stream comprising TCS and low boilers such as DCS from the third column is preferably conducted into a fourth column, with feeding of inert gas, and discharge of a top stream from the fourth column comprising boron-enriched DCS, supply of a bottom stream from the fourth column back to the separating column, and disposal of a secondary stream comprising offgas from the fourth column.

Said fourth column is preferably operated at elevated pressure.

Preferably, the top stream from the third column comprising TCS and low boilers such as DCS is liquefied prior to supply to the fourth column.

The essential steps are the production of chlorosilanes, preferably TCS, by hydrochlorination of metallurgical silicon, the distillative purification of the chlorosilanes and the removal of highly boron-contaminated DCS and STC fractions from this mixture of chlorosilanes.

Thus, the relatively high-boiling boron impurities are concentrated in an STC substream, and low-boiling boron compounds in a DCS substream.

The trichlorosilane thus purified has an extremely low boron content.

Before the purified trichlorosilane is released for use to a reactor for deposition of polycrystalline silicon, the dopant content in the trichlorosilane is measured.

The TCS used for the deposition must satisfy the following conditions:

The TCS contains at most 20 ppta of boron, at most 90 ppta of phosphorus, less than 20 ppta of arsenic and less than 1 ppta of aluminum.

The TCS preferably contains 1-20 ppta of boron.
The TCS preferably contains 1-90 ppta of phosphorus.
The TCS preferably contains 1-20 ppta of arsenic.
The TCS preferably contains 0.01 to 1 ppta of aluminum.

The dopant concentration in TCS is determined indirectly by means of test deposition in a small Siemens test reactor, using said TCS as the silicon component. The polysilicon deposited is processed further by growth of a single crystal by means of FZ from the polycrystalline silicon and removal of a rod piece. An etching step with HF/HNO3 is followed by measurement of the dopant concentration by means of photoluminescence. In order to ensure that the TCS meets the abovementioned conditions, the TCS purified by a distillation process can be introduced into a tank during the analysis by means of test deposition, the tank only being approved for the deposition of polycrystalline silicon after the measurement result is available.

The 100% monitoring of the trichlorosilane allows assurance of a uniform quality of the polycrystalline silicon produced.

b) Test Deposition for Monitoring of the Dopants in the Trichlorosilane

The test deposition involves deposited polycrystalline silicon using the TCS to be analyzed.

For this purpose, a reactor comprising filament rods which are supplied with power by means of an electrode and are heated by direct passage of current is used.

Through introduction of TCS and hydrogen, polycrystalline silicon is deposited on the filament rods.

It is important to ensure that the polysilicon is not contaminated in the course of deposition. Only in this way does the test deposition permit an exact conclusion about the purity of the TCS used.

For this purpose, one end of the reactor on which the electrodes for power supply to the filament rods are arranged is covered with silicon.

This is preferably silicon having a defined and very low dopant content.

It is preferably silicon with the following dopant concentrations:

boron max. 10 ppta and phosphorus max. 20 ppta.

The silicon preferably additionally contains max. 20 ppta of aluminum and max. 20 ppta of arsenic.

After the deposition, the polycrystalline silicon rod is removed from the reactor. A core sample of the poly silicon rod is used to obtain a single crystal by means of zone pulling. This single crystal, or a rod piece removed therefrom, is subsequently analyzed for impurities, especially for contamination with dopants. An etching step with HF/HNO3 is followed by measurement of the dopant concentration by means of photoluminescence.

The detection limits for dopants are about 1 ppta.

c) Deposition of Polycrystalline Silicon

If the determination of the dopant concentrations in the TCS after the test deposition shows that the TCS meets the abovementioned conditions with regard to boron, phosphorus, arsenic and aluminum content, it can be used for deposition of the inventive polycrystalline silicon.

The deposition is effected in a conventional Siemens process.

The Siemens reactor comprises inlet lines for supply of reaction gases (TCS and hydrogen) to the reactor and outlet lines for removal of offgas formed in the course of deposition.

After the end of deposition, which involves cooling the silicon rods to room temperature, the reactor is opened and the silicon rods are removed from the reactor.

From the time at which the reactor is opened and during the deinstallation of the silicon rods, an inert gas is flushed into the reactor via the inlet and outlet lines. The inert gas used may be a nitrogen or a noble gas such as argon.

The inert gas flush is described in detail in U.S. Pat. No. 7,927,571, which is fully incorporated here by reference.

As well as the low phosphorus level, this ensures that no moisture can be introduced into the process. This prevents corrosion or other introduction of metals into the polycrystalline silicon.

EXAMPLES

TCS was used in a test reactor in order subsequently to analyze it for boron and phosphorus content.

9 TCS batches were analyzed, which have passed through an above-described distillation.

Dopants (B, P) were analyzed by means of photoluminescence to SEMI MF 1398 on an FZ single crystal obtained from the polycrystalline material (SEMI MF 1723).

Table 1 shows the resulting values in ppta.

TABLE 1

|    | P    | B   |
|----|------|-----|
| #1 | 19.4 | 3.7 |
| #2 | 19.1 | 3.0 |
| #3 | 19.4 | 3.3 |
| #4 | 21.1 | 3.7 |
| #5 | 19.2 | 3.9 |
| #6 | 19.2 | 3.4 |
| #7 | 19.3 | 3.5 |
| #8 | 19.1 | 3.0 |
| #9 | 19.8 | 2.8 |

Apart from sample #4, all TCS batches meet the condition that the boron content in the TCS must not be more than 20 ppta.

This can be used for deposition of the inventive polycrystalline silicon.

Dopants, metals and lifetime were determined on five batches of polycrystalline silicon obtained with such TCS.

Metal contents were analyzed by means of INAA on a sample obtained from the polycrystalline material to SEMI PV10-1110.

Table 2 shows the resulting values in pptw.

TABLE 2

| Element | #1    | #2   | #3   | #4  | #5   |
|---------|-------|------|------|-----|------|
| Na      | 729   | 936  | 934  | 899 | 855  |
| Fe      | 74    | 58   | 98   | 98  | 44   |
| Cu      | 247   | 149  | 131  | 41  | 41   |
| Ni      | 15    | 8.1  | 12.9 | 17  | 7.5  |
| Cr      | 9.41  | 3.1  | 1.6  | 1.6 | 0.89 |
| Zn      | 17.15 | 3.8  | 7.6  | 5.7 | 3.4  |

In addition, the dopants of the polycrystalline silicon were determined.

Table 3 shows the resulting values in ppta.

TABLE 3

| Element | #1   | #2   | #3  | #4  | #5   |
|---------|------|------|-----|-----|------|
| P       | 13   | 14   | 15  | 16  | 19   |
| B       | 6    | 5    | 5   | 6   | 6    |
| As      | 3    | 6    | 6   | 4   | 6    |
| Al      | 0.02 | 0.05 | 0.1 | 0.2 | 0.08 |

To measure the lifetime, rod-shaped samples having a diameter of 19 mm were drilled out of the polycrystalline silicon and pulled to a monocrystalline rod by the FZ method to ASTM Std. F1723-96. The resulting single crystal had a rod thickness of 19 mm.

The charge carrier lifetime was measured on the single crystal.

A contactless process to SEMI PV9-0611 was employed, in which the changing conductivity with time after a light excitation is determined by inductive means.

Table 4 shows the resulting values in is.

TABLE 4

| Measurement | 1 | 2 | 3 | 4 | 5 | 6 | 7 | 8 | 9 | 10 |
|---|---|---|---|---|---|---|---|---|---|---|
| Lifetime | 2568 | 2601 | 2577 | 2653 | 2808 | 3593 | 4056 | 2581 | 2683 | 2946 |

What is claimed is:

1. Polycrystalline silicon comprising dopants in the following concentrations
   1-10 ppta of boron,
   1-20 ppta of phosphorus,
   1-10 ppta of arsenic,
   and 0.01-1 ppta of aluminum,
   wherein the polycrystalline silicon is deposited from trichlorosilane on a filament rod of silicon and has a charge carrier lifetime of at least 2000 and at most 4500 µs.

2. The polycrystalline silicon as claimed in claim 1, having a phosphorus concentration of 1-10 ppta.

3. The polycrystalline silicon as claimed in claim 1, having a boron concentration of 1-5 ppta.

4. The polycrystalline silicon as claimed in claim 1, having an arsenic concentration of 1-5 ppta.

5. The polycrystalline silicon as claimed in claim 1, having a bulk concentration of Fe, Cu, Ni, Cr, Zn and Na totaling less than 1400 pptw.

6. The polycrystalline silicon as claimed in claim 1, having a bulk concentration of Fe of 10-100 pptw.

7. The polycrystalline silicon as claimed in claim 1, having a bulk concentration of Cu of 10-250 pptw.

8. The polycrystalline silicon as claimed in claim 1, having a bulk concentration of Ni of 1-20 pptw.

9. The polycrystalline silicon as claimed in claim 1, having a bulk concentration of Cr of 0.1-10 pptw.

10. The polycrystalline silicon as claimed in claim 1, having a bulk concentration of Zn of 1-20 pptw.

11. The polycrystalline silicon as claimed in claim 1, having a bulk concentration of Na of 10-1000 pptw.

12. The polycrystalline silicon as claimed in claim 2, having a boron concentration of 1-5 ppta.

13. The polycrystalline silicon as claimed in claim 12, having an arsenic concentration of 1-5 ppta.

14. The polycrystalline silicon as claimed in claim 13, having a bulk concentration of Fe, Cu, Ni, Cr, Zn and Na totaling less than 1400 pptw.

15. The polycrystalline silicon as claimed in claim 14, having a bulk concentration of Fe of 10-100 pptw.

16. The polycrystalline silicon as claimed in claim 15, having a bulk concentration of Cu of 10-250 pptw.

17. The polycrystalline silicon as claimed in claim 16, having a bulk concentration of Ni of 1-20 pptw.

18. The polycrystalline silicon as claimed in claim 17, having a bulk concentration of Cr of 0.1-10 pptw.

19. The polycrystalline silicon as claimed in claim 18, having a bulk concentration of Zn of 1-20 pptw.

20. The polycrystalline silicon as claimed in claim 19, having a bulk concentration of Na of 10-1000 pptw.

* * * * *